United States Patent
Meng et al.

(10) Patent No.: US 11,527,380 B2
(45) Date of Patent: Dec. 13, 2022

(54) ION IMPLANTER TOXIC GAS DELIVERY SYSTEM

(71) Applicant: Taiwan Semiconductor Manufacturing Co., Ltd., Hsinchu (TW)

(72) Inventors: Ying-Chieh Meng, Hsinchu (TW); Chui-Ya Peng, Hsinchu (TW); Shih-Hao Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 276 days.

(21) Appl. No.: 16/837,724

(22) Filed: Apr. 1, 2020

(65) Prior Publication Data
US 2021/0313144 A1 Oct. 7, 2021

(51) Int. Cl.
*H01J 37/32* (2006.01)
*H01J 37/317* (2006.01)
*H01J 37/08* (2006.01)
*H01L 21/265* (2006.01)

(52) U.S. Cl.
CPC .......... *H01J 37/3171* (2013.01); *H01J 37/08* (2013.01); *H01J 37/3244* (2013.01); *H01L 21/26513* (2013.01); *H01J 37/32412* (2013.01); *H01J 2237/006* (2013.01); *H01J 2237/1825* (2013.01)

(58) Field of Classification Search
CPC ............... H01J 37/3171; H01J 37/3244; H01J 37/32412; F16L 9/18
See application file for complete search history.

(56) References Cited

U.S. PATENT DOCUMENTS

| | | | |
|---|---|---|---|
| 6,180,954 B1 | 1/2001 | Verrier et al. | |
| 6,515,290 B1 | 2/2003 | Rzeszut et al. | |
| 8,178,428 B2 | 5/2012 | Noda et al. | |
| 2005/0005957 A1* | 1/2005 | Yamagata | B08B 7/0021 134/200 |
| 2005/0166666 A1* | 8/2005 | Tsukagoshi | G01M 3/283 73/49.1 |
| 2012/0048000 A1 | 3/2012 | Kirzhner | |
| 2013/0251913 A1 | 9/2013 | Olander et al. | |

(Continued)

FOREIGN PATENT DOCUMENTS

| CN | 1118655 C | 8/2003 |
|---|---|---|
| CN | 1204954 C | 6/2005 |

(Continued)

*Primary Examiner* — Tung X Le
(74) *Attorney, Agent, or Firm* — Seed IP Law Group LLP

(57) ABSTRACT

An ion implantation system including an ion implanter, a dopant source gas supply system and a monitoring system is provided. The ion implanter is inside a housing and includes an ion source unit. The dopant source gas supply system includes a first and a second dopant source gas storage cylinder in a gas cabinet outside of the housing and configured to supply a dopant source gas to the ion source unit, and a first and a second dopant source gas supply pipe coupled to respective first and second dopant source gas storage cylinders. Each of the first and second dopant source gas supply pipes includes an inner pipe and an outer pipe enclosing the inner pipe. The monitoring system is coupled to the outer pipe of each of the first and the second dopant source gas supply pipes.

20 Claims, 5 Drawing Sheets

(56) References Cited

U.S. PATENT DOCUMENTS

2016/0093476 A1* 3/2016 Toyoda ............. H01J 37/32449
                                                    118/723 R
2017/0338075 A1* 11/2017 Byl ........................ H01J 27/16
2020/0200329 A1* 6/2020 Valentin de Oliveira ...................
                                                    F16L 9/18

FOREIGN PATENT DOCUMENTS

| CN | 110890259 A    | 3/2020  |
|----|----------------|---------|
| JP | S61-82083 A    | 4/1986  |
| JP | 2012-052531 A  | 3/2012  |
| KR | 20-0134818 Y1  | 3/1999  |
| KR | 10-2003-0029915 A | 4/2003 |
| KR | 10-2003-0034065 A | 5/2003 |
| TW | 507246 B       | 10/2002 |
| TW | 1446411 B      | 7/2014  |
| WO | 01/83084 A1    | 11/2001 |
| WO | 02/21566 A2    | 3/2002  |

* cited by examiner

ION IMPLANTER TOXIC GAS DELIVERY SYSTEM

BACKGROUND

Ion implantation is a process for introducing chemical species into a substrate by direct bombardment of the substrate with energized ions. In semiconductor manufacturing, ion implantation is commonly used to introduce dopants into a semiconductor wafer to modify electronic properties of the semiconductor wafer.

The ion implantation process is carried out in an ion implanter. An ion implanter usually includes a source arc chamber in which an electrical discharge interacts with a gas to create a plasma of a variety of ion species, including a desired ion specie to be impinged into a target, e.g., a target region on a semiconductor wafer. The ion species are extracted from the source arc chamber and are then filtered to obtain the desired ion species. The desired ion species are further accelerated and directed to the target for implanting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
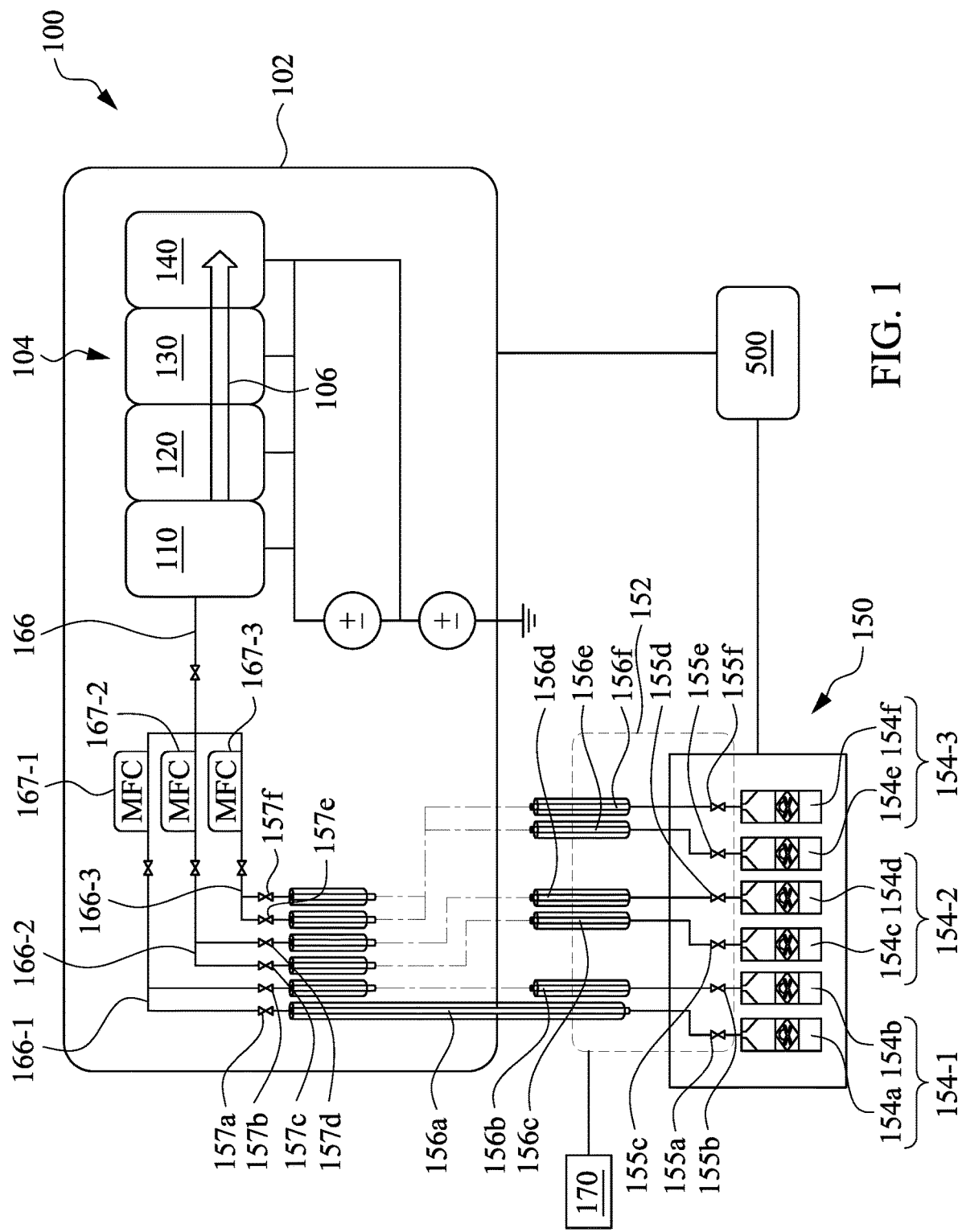
FIG. 1 is a schematic diagram of an ion implantation system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typical dopant species for silicon-based integrated circuits include boron as a p-type dopant, and phosphorus or arsenic as an n-type dopant. Dopant species are generated from dopant source gases, such as boron trifluoride ($BF_3$), phosphine ($PH_3$), and arsine ($AsH_3$). These dopant source gases are highly toxic, and to prevent others from being endangered by toxic gases used in the ion implantation process, the dopant source gases have been supplied in gas cylinders.

An ion implantation system is typically configured to include an outer enclosure housing within which a gas box for supply of dopant source gases, an ion source unit for ionization of the dopant source gases, and an ion implanter including accelerator and magnetic separation components are disposed. The gas cylinders containing the toxic/hazardous dopant source gases are located in the gas box. The gas box is an enclosure connected to and at the same high voltage as the ion source unit in operation.

In conventional ion implantation system, the gas cylinders containing the toxic/hazardous dopant source gases have to be periodically changed out and replaced by fresh cylinders charged with the dopant source gases. To carry out such change-out of gas cylinders located inside the gas box of the ion implantation system, technicians must wear self-contained breathing apparatus (SCBA) units, physically remove the exhausted gas cylinders from the gas box and install fresh gas cylinders in the gas box. Significant safety issues in handling of these dopant source gas cylinders are thus raised.

In addition to the dangers associated with such change-out of gas cylinders in the ion implantation system, it is also a common occurrence that the gas cylinders become exhausted during production operations, so that the ion implantation system must be shut down in order to carry out the change-out of gas cylinders. Such unscheduled shutdown of the ion implantation system can cause expensive reworking of partially processed wafers, and in some cases the wafer products may be deficient or even useless for their intended purpose, as a consequence of the interruption of their processing. Such events can in turn seriously adversely affect the ion implanter system and the economics of the semiconductor manufacturing facility in which such ion implanter system is located.

In embodiments of the present disclosure, an ion implantation system including a dopant source gas supply system configured to supply one or more dopant source gases to an ion implanter from a location remote of the ion implanter is provided. Placing the dopant source gas supply system outside of a housing within which the ion implanter is placed helps to reduce the footprint of the ion implanter. In the dopant gas supply system of the present disclosure, dual dopant source gas storage cylinders are used for supplying a single dopant source gas to the ion implanter such that when one dopant source gas storage cylinder is about to empty, the system can be switched to the other dopant source gas storage cylinder to allow the continuous supply of the dopant source gas to the ion implanter. The empty dopant source gas storage cylinder can then be replaced without needing to disrupt the ion implantation process. As a result, the operational efficiency and on-stream time of the ion implantation system are enhanced. The ion implantation system further includes a monitoring system configured to in situ monitor the leakage of the dopant source gases from the dopant source gas supply pipes adapted to couple the dopant source gas storage cylinders to the ion implanter. The ion implantation system, thus, provides an enhanced safety in the event of leakage of the dopant source gases.

FIG. 1 is a schematic diagram of an ion implantation system 100, in accordance with some embodiments. Referring to FIG. 1, the ion implantation system 100 includes a housing 102 defining an enclosure. Inside the housing 102, an ion implanter 104 for performing ion implantation processes is disposed. The ion implantation system 100 further includes a dopant source gas supply system 150 configured to supply one or more dopant source gases to the ion implanter 104. The ion implantation system 100 further includes a monitoring system 170 configured to in situ monitor the leakage of one or more dopant source gases during ion implantation process. The ion implantation system 100 is communicatively coupled with a control unit 500 (described in detail in FIG. 5). Components of the ion implantation system 100 receive control signals from the control unit 500 and perform various operations based on the control signals received.

In some embodiments, the ion implanter 104 includes an ion source unit 110, a mass analyzer unit 120, an ion acceleration unit 130, and an end station 140. The ion implanter 104 is configured to generate an ion beam 106, transmit the ion beam 106 toward the end station 140, and impinge the ion beam 106 on a workpiece, for example, a semiconductor wafer, in the end station 140.

The ion source unit 110 is configured to ionize a desired dopant element from a dopant source gas. The ion source unit 110 generates ions by introducing electrons into a vacuum arc chamber filled with the dopant source gas. Collisions of the electrons with atoms and molecules in the dopant source gas result in the creation of an ionized plasma consisting of positive and negative ions. The generated ions are extracted out of the ion source unit 110 by applying a high voltage to form the ion beam 106. To generate the ion beam 106, the ion source unit 110 is maintained at a positive potential to generate ions and extract the generated ions. In some embodiments, the ion source unit 110 is maintained at a high potential, for example, from about 5 kV up to about 250 kV.

The mass analyzer unit 120 is positioned along the beam path between the ion source unit 110 and the end station 140. The mass analyzer unit 120 has a curved internal passage and one or more magnets arranged along the internal passage of the mass analyzer unit 120. As the ion beam 106 enters the internal passage of the mass analyzer unit 120, the ion beam 106 is bent by the magnetic field of the magnets. As a result, ions in the ion beam 106 that have a charge-to-mass ratio outside of a predetermined range are deflected into sidewalls of the internal passage, while the selected ions in the ion beam 106 which have a charge-to-mass ratio within the predetermined range are allowed to exit the mass analyzer unit 120.

The ion accelerator unit 130 is configured to apply an accelerating voltage to the ion beam 106 after the ion beam 106 exits the mass analyzer unit 120, thereby bringing the ion beam 106 to a desired implantation energy before the ion beam 106 reaches the end station 140. In embodiments, the accelerating voltage is adjusted in a range from about 50 kV to about 250 kV.

The end station 140 is located at the end of the beam path. The end station 140 is configured to receive the ion beam 106 and direct the ion beam 106 toward a workpiece. In some embodiments, the end station 140 includes a chuck (not shown) for holding the workpiece thereon, and an actuator (not shown) for moving the chuck, with the workpiece held thereon, in one or more directions. The movements of the chuck are configured so that the ion beam 106 impinges in a uniform manner on the workpiece. In some embodiments, the end station 140 includes a load lock for transferring the workpiece into or out of the ion implanter 104, and a robot arm for transferring the workpiece between the chuck and the load lock. In some embodiments, the end station 140 further includes a measuring device for measuring one or more properties of the ion beam 106 to be impinged on the workpiece, thereby providing feedback information for adjusting the ion beam 106 in accordance with a processing recipe to be applied to the workpiece. Examples of measured ion beam properties include, but are not limited to, beam profile, beam energy and beam current.

The dopant source gas supply system 150 is disposed outside of the housing 102. The dopant source gas supply system 150 is operable to supply different types of dopant source gases to the ion source unit 110 in a parallel type fashion to facilitate an easy change between dopant source gases (e.g., to allow an easy change from an n-type dopant to a p-type dopant). For example, for an n-type dopant, a gaseous hydride such as arsine ($AsH_3$) or phosphine ($PH_3$) is commonly used as a dopant source gas, while for a p-type dopant, a gaseous fluoride such as boron difluoride is commonly used as a dopant source gas. All these dopant source gases are toxic and corrosive and require appropriate handling.

Figure 3:
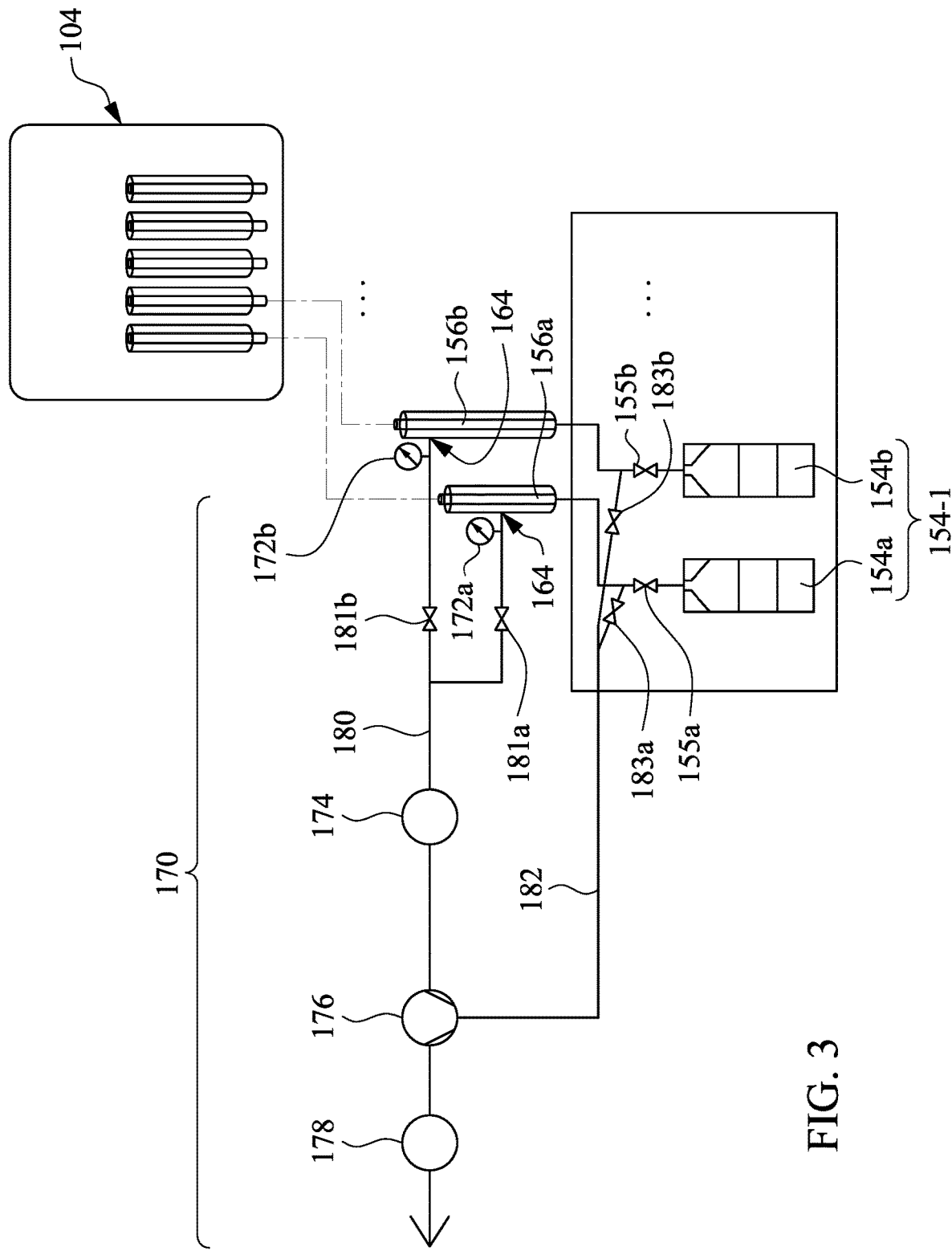
FIG. 3 is a schematic diagram of a monitoring system in the ion implantation system of FIG. 1, in accordance with some embodiments.

The dopant source gas supply system 150 includes a gas cabinet 152 defining an enclosure. Within the gas cabinet 152, dopant source gas storage cylinders 154a-154f are disposed. The gas cabinet 152 and the dopant source gas storage cylinders 154a-154f are maintained at ground voltage stages during the flow of a dopant source gas from a corresponding dopant source gas storage cylinder 154a-154f to the ion source unit 110. In some embodiments, the dopant source gas storage cylinders 154a-154f are grouped in pairs, each pair being composed of two adjacent dopant source gas storage cylinders adapted to supply a particular dopant source gas to the ion source unit 110. For example, in some embodiments, the dopant source gas storage cylinders 154a-154f are arranged to include a first pair 154-1 (e.g., dopant source gas storage cylinders 154a and 154b) adapted to supply an arsenic-containing gas such as $AsH_3$ to the ion source unit 110, a second pair 154-2 (e.g., dopant source gas storage cylinders 154c and 154d) adapted to supply a phosphorous-containing gas such as $PH_3$ to the ion source unit 110, and a third pair 154-3 (e.g., dopant source gas storage cylinders 154e and 154f) adapted to supply a boron-containing gas such as $BF_3$ to the ion source unit 110. It should be noted that the dopant source gas supply system 150 of FIG. 3 illustrates a system which provides for the delivery of three (3) different types of dopant source gas, however, systems which provide for more or fewer dopant source gases are contemplated.

Each of the dopant source gas storage cylinders 154a-154f includes a valve, e.g., valve 155a-155f, intended to control the supply of a particular dopant source gas from a corresponding dopant source gas storage cylinder 154a-154f. The valves 155a-155f are controlled such that during the operation of the ion implanter 104, for each pair of dopant source gas storage cylinders 154-1, 154-2 or 154-3, when the first valve (e.g., valve 155a, 155c or 155e) for a corresponding first dopant source gas storage cylinder (e.g., for dopant source gas storage cylinders 154a, 154c or 154e) is placed at an open position to supply a corresponding dopant source gas to the ion source unit 110, the second valve (e.g., valve 155b, 155d or 155j) for a corresponding second dopant source gas storage cylinder (e.g., dopant source gas storage cylinder 154b, 154d or 154f) is placed at a closed positon to maintain the second dopant source gas storage cylinder 154b, 154d or 154f in a standby condition. Then, when the dopant source gas in the first dopant source gas storage cylinder 154a, 154c or 154e nears an empty condition or when the leakage of the dopant source gas from the first dopant source gas storage cylinder 154a, 154c or 154e occurs, the second valve 155b, 155d or 155f is opened to provide the dopant source gas from the second dopant source gas storage cylinder 154b, 154d or 154f The first dopant source gas storage cylinder 154a, 154c or 154e can then be removed from the gas cabinet 152 and replaced with a full dopant source gas storage cylinder, or a broken pipe can be replaced if a leakage occurs. Such dual dopant source gas storage cylinder configuration helps to reduce the downtime of the ion implanter 104 associated with the replacement of the empty dopant source gas storage cylinder when only a single dopant source gas storage cylinder is provided. As a resulting, the efficiency and productivity of the ion implantation system 100 are enhanced.

The dopant source gas supply system 150 further includes dopant source gas supply pipes 156a-156f adapted to carry the dopant source gas from respective dopant source gas storage cylinders 154a-154f to the ion source unit 110. In FIG. 1, only dopant source gas supply pipe 156a is shown to extend into the housing 102, portions of dopant source gas supply pipes 156b-156f are represented using dash lines, respectively. Valves 157a-157f are coupled to respective dopant source gas supply pipes 156a-156f for controlling the flow of dopant source gases in respective dopant source gas supply pipes 156a-156f.

Figure 2:
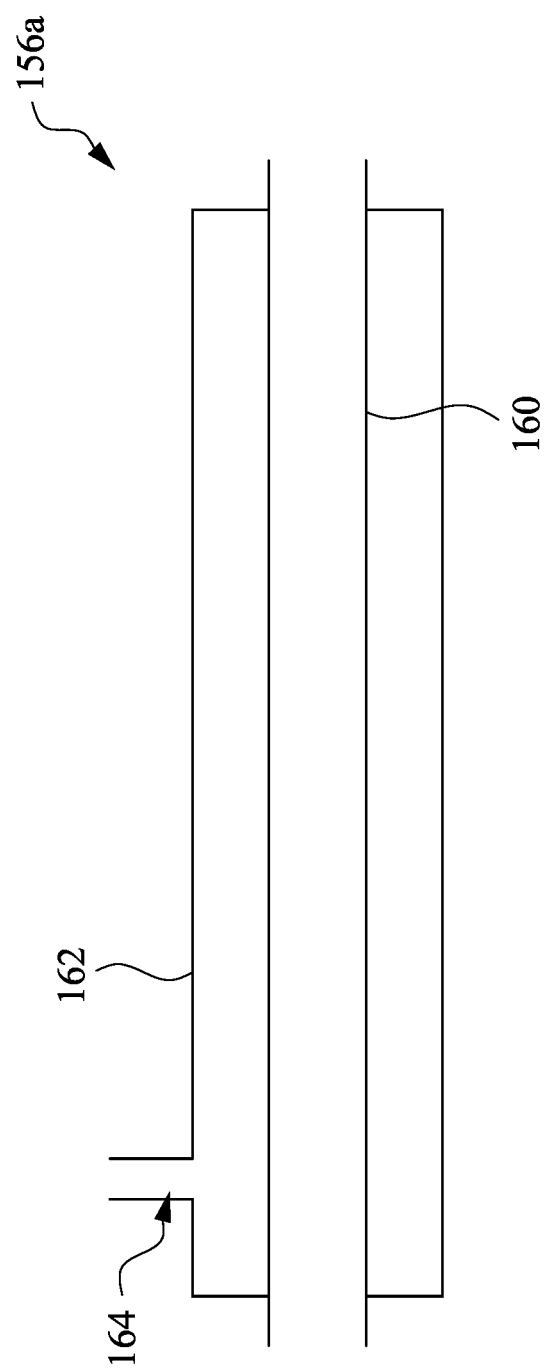
FIG. 2 is a diagram of a dopant source gas supply pipe used in a dopant source gas supply system in the ion implantation system of FIG. 1, in accordance with some embodiments.

FIG. 2 is a diagram of a dopant source gas supply pipe, in accordance with some embodiments. Because each of the dopant source gas supply pipes 156a-156f operates in a similar manner, only one dopant source gas supply pipe 156a is described in FIG. 2 for purposes of simplicity and brevity. In some embodiments, the source gas supply pipe 156a has a double pipe structure composed of an inner pipe 160 through which a dopant source gas is introduced to the ion source unit 110 and an outer pipe 162 enclosing the inner pipe 160. The opposite ends of the outer pipe 162 are closed to form a sealed space between the inner pipe 160 and the outer pipe 162. The outer pipe 162 is provided with an outlet port 164 to be in fluidic communication with the space defined between the inner pipe 160 and the outer pipe 162. The outlet port 164 is coupled to an exhaust pipe configured to exhaust the dopant source gas leaked from the inner pipe 160. In some embodiments, both the inner pipe 160 and the outer pipe 162 have a circular shape, however, a shape of the inner pipe 160 and the outer pipe 162 is not limited thereto and any shapes of the inner pipe 160 and the outer pipe 162 such as hexagonal shape and oval shape are contemplated.

The dopant source gas supply pipes 156a-156f have to across a high voltage gap, e.g., from about 5 kV to about 250 kV, in order to carry the dopant source gas from a dopant source gas storage cylinder 154a-154f in the gas cabinet 152 to the ion source unit 110 inside the housing 102. To accommodate the high voltage operation of the ion implanter 104, the inner pipes 160 and the outer pipes 162 of the dopant source gas supply pipes 156a-156f are made of an electrically insulating material, such as, for example, polytetrafluoroethylene (PTFE), polypropylene (PP), polyethylene (PE), polyvinyl chloride (PVC), or a ceramic material. The insulating pipe material helps to reduce the risk of arcing or plasma discharge in the dopant source gas supply pipes 156a-156f during ion implantation processes.

Referring back to FIG. 1, the dopant source gas supply pipes 156a-156f are coupled to a dopant source gas input manifold 166 that connects the dopant source gas supply pipes 156a-156f to the ion source unit 110. In some embodiments, the dopant source gas input manifold 166 includes a first branch line 166-1 coupled to the dopant source gas supply pipes 156a and 156b, a second branch line 166-2 coupled to the dopant source gas supply pipes 156c and 156d, and a third branch line 166-3 coupled to the dopant source gas supply pipes 156e and 156f. Mass flow controllers 167-1, 167-2 and 167-3 are coupled to respective branch lines 166-1, 166-2, 166-3 of the dopant source gas input manifold 166 to adjust the flow rates of the dopant source gases received from respective dopant source gas storage cylinder 154a-154f. By controlling a corresponding mass flow controller 167-1, 167-2, 167-3, a predetermined amount of a dopant source gas is injected into the ion source unit 110.

The monitoring system 170 is configured to continuously monitor the leak of each of the dopant source gas supply pipes 156a-156f. FIG. 3 is a schematic view of the monitoring system 170, in accordance with some embodiments. Because the monitoring system 170 is coupled to respective dopant source gas supply pipes 156a-156f and respective dopant source gas storage cylinders 154a-154f in a similar manner, only two dopant source gas supply pipes 156a and 156b and two dopant source gas storage cylinders 154a and 154b in the first pair 154-1 are shown in FIG. 3 for simplicity.

The monitoring system 170 is coupled to the outlet ports 164 of outer pipes 162 of respective dopant source gas supply pipes 156a-156f via an exhaust manifold 180. The monitoring system 170 includes a plurality of pressure sensors 172a-172f a gas sensor 174 downstream of the plurality of the pressure sensors 172a-172f a vacuum pump 176 downstream of the gas sensor 174, and a scrubber 178 downstream of the vacuum pump 176. In FIG. 3, the gas sensor 174, the vacuum pump 176 and the scrubber 178 are coupled to the pressure sensors 172a and 172b via respective branch lines of the exhaust manifold 180. The pressure sensors 172a and 172b are coupled to outlet ports 164 of respective dopant source gas supply pipes 156a-156f via respective branch lines of the exhaust manifold 180. The pressure sensors 172a and 172b are adapted to provide continuous monitoring of pressure changes in outer pipes 162 of respective dopant source supply pipes 156a and 156b. In some embodiments, the pressure sensors 172a, 172b are vacuum gauges. The gas sensor 174 is adapted to detect and measure the presence of any of dopant source gases used for ion implantation once the inner pipe 160 of a corresponding dopant source gas supply pipe 156a-156f ruptures which causes leakage of a dopant source gas. The vacuum pump 176 is adapted to create a vacuum within the space between the inner pipe 160 and the outer pipe 162 of each of the dopant source gas supply pipes 156a-156f and to exhaust any leaked dopant source gas confined in the outer pipe 162 through the exhaust manifold 180. In some embodiments, the vacuum pump 176 includes a turbo pump and a dry pump. The scrubber 178 is adapted to detoxify the leaked dopant source gas exhausted from the exhaust manifold 180 before the leaked dopant source gas is exhausted out of the ion implantation system 100. Valves 181a-181f are coupled to respective branch lines of the exhaust manifold 180. In FIG. 3, only valve 181a coupled to dopant source gas supply pipe 156a and valve 181b coupled to dopant source gas supply pipe 156b are shown. During ion implantation, in instances where the dopant source gas storage cylinder 154a is used to supply the dopant source gas to the ion implanter 104, the valve 181a is opened to couple the dopant source gas supply pipe 156a to the monitoring system 170, while valve 181b is closed to isolate the dopant source gas supply pipe 156b from the monitoring system 170. On the other hand, in instances where the dopant source gas storage cylinder 154b is used to supply the dopant source gas to the ion implanter 104, the valve 181b is opened to couple the dopant source gas supply pipe 156b to the monitoring system 170, while valve 181a is closed to isolate the dopant source gas supply pipe 156a from the monitoring system 170.

In some embodiments, the vacuum pump 176 is also coupled to each of the dopant source gas storage cylinders 154a-154f via an exhaust manifold 182. Valves 183a-183f are coupled to respective branch lines of the exhaust manifold 182. For simplicity, only valve 183a coupled to dopant source gas storage cylinder 154a and valve 183b coupled to dopant source gas storage cylinder 154b are shown in FIG. 3. Valves 183a-183f are normally closed. During ion implantation, when a first dopant source gas storage cylinder in a pair of the dopant source gas storage cylinders, e.g., dopant source gas storage cylinder 154a in the first pair of dopant source gas storage cylinders 154-1 is about to empty, valve 157a is closed and valves 155b and 157b are opened such that the dopant source gas supply system 150 is switched to use the second dopant source gas storage cylinder 154b in the first pair of dopant source gas storage cylinders 154-1 to supply the dopant source gas to the ion source unit 110. The valve 183a is then opened such that the vacuum pump 176 is in fluidic communication with the dopant source gas storage cylinder 154a. The vacuum pump 176 evacuates the residual dopant source gas in the dopant source gas storage cylinder 154a. As a result, the safety issue caused by the releasing of the toxic dopant source gas to the atmosphere during replacement of the exhausted dopant source gas storage cylinder is prevented.

Figure 4:
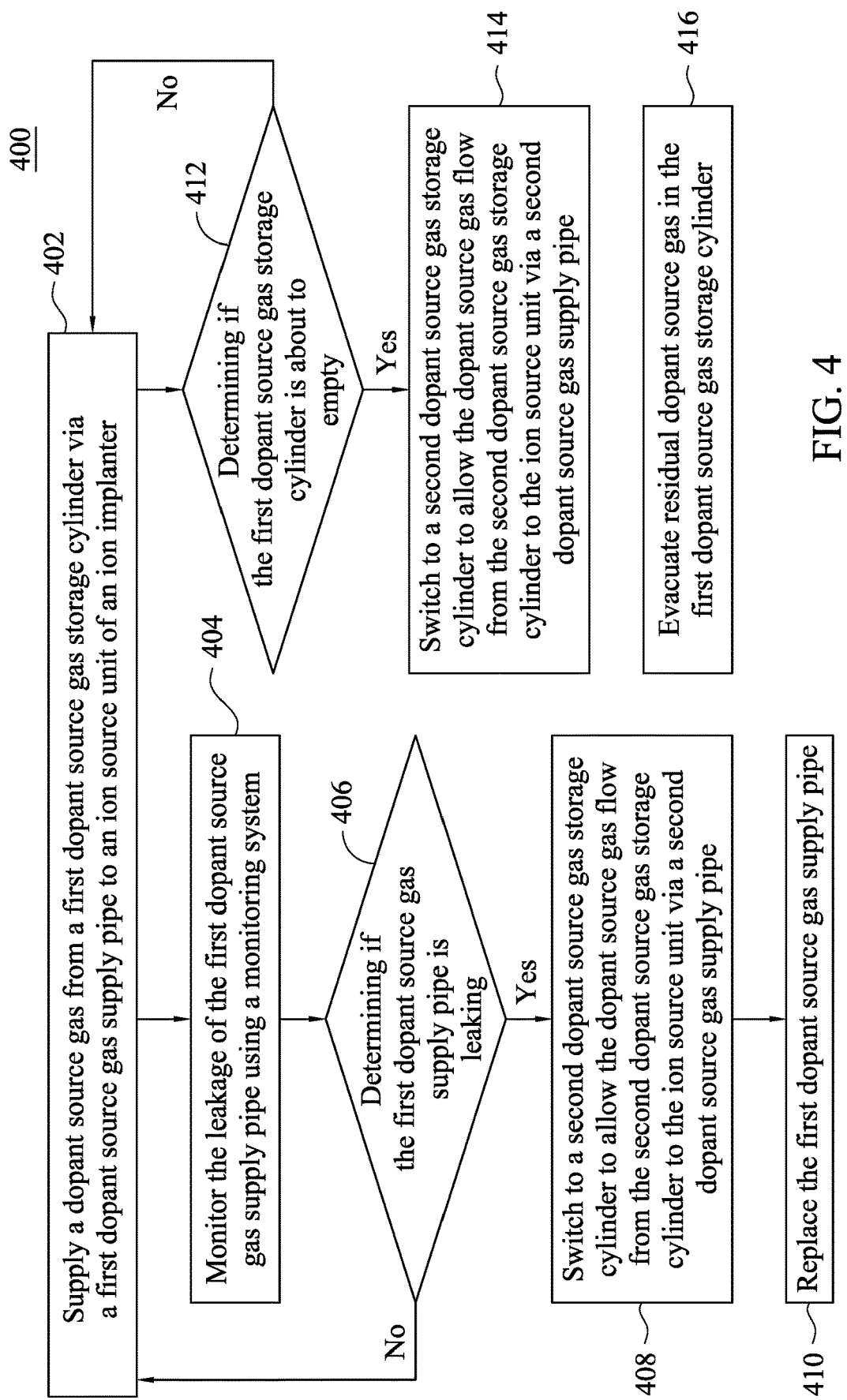
FIG. 4 is a flowchart of a method of using the ion implantation system of FIG. 1, in accordance with some embodiments.

FIG. 4 is flowchart of a method 400 of using the ion implantation system 100 of FIG. 1, in accordance with some embodiments. One or more components of the ion implantation system 100 is/are controlled by the control unit 500 (FIG. 5) to perform the method 400.

The method 400 includes operation 402 in which a predetermined amount of a dopant source gas, for example, an $AsH_3$ gas is supplied from a dopant source gas supply system 150 to an ion source unit 110 of an ion implanter 104. The dopant source gas supply system 150 is placed remotely from the ion implanter 104. In some embodiments, the dopant source gas is supplied from a dopant source gas storage cylinder 154a in a first pair of dopant source gas storage cylinders 154-1 to the ion source unit 110 via the dopant source gas supply pipe 156a. In response to a control signal from the control unit 500 requesting supplying a dopant source gas from the dopant source gas storage cylinder 154a, valves 155a, 157a, and 167-1 are opened to allow the predetermined amount of the dopant source gas flowing from the dopant source gas storage cylinder 154a to the ion source unit 110. Valve 181a is opened so that the outer pipe 162 of dopant source gas supply pipe 156a is maintained under a vacuum.

In operation 404, the leakage of the dopant source gas supply pipe 156a is monitored using the monitoring system 170 as the dopant source gas flows from the dopant source gas storage cylinder 154a to the ion source unit 110. The leakage of the dopant source gas supply pipe 156a is monitored by the pressure sensor 172a and the gas sensor 174 coupled to the dopant source gas supply pipe 154a.

In operation 406 the leakage of the dopant source gas supply pipe 156a is determined. In instances where the outer pipe 162 of the dopant source gas supply pipe 156a is leaking, the pressure in the outer pipe 162 increases. Once the increased pressure is sensed by the pressure sensor 172a, an alarm is triggered to report the leakage of the outer pipe 162. In instances where the inner pipe 160 of the dopant source gas supply pipe 156a is leaking, the presence of the leaked dopant source gas is detected by the gas sensor 174. In the meantime, the dopant source gas leaked from the inner pipe 160 also causes the increase of pressure in the outer pipe 162, which can be detected by the pressure sensor 172a. Once the leaked dopant source gas is detected by the gas sensor 174, an alarm is triggered to report the leakage from the inner pipe 160.

If the monitoring system 170 indicates a leakage in the dopant source gas supply pipe 156a, the method 400 proceeds to operation 408. In operation 408, in response to the alarm indicating the leakage of the dopant source gas supply pipe 156a, valves 155a and 171a are closed to stop the gas flow from the dopant source gas storage cylinder 154a, while valves 155b and 157b are opened to supply the predetermined amount of the dopant source gas from the dopant source gas storage cylinder 154b to the ion source unit 110. In the meantime, valve 181a is closed and valve 181b is opened so that the outer pipe 162 of dopant source gas supply pipe 156b is maintained under a vacuum.

In operation 410, the leaking dopant source gas supply pipe 156a is replaced.

If no leakage in the dopant source gas supply pipe 156a is detected, the operation 402 continues until the dopant source gas storage cylinder 154a is about to empty. The method 400 proceeds to operation 412, in which a determination is made when the dopant source gas storage cylinder 154a is about to empty.

In operation 414, in response to the signal indicating the dopant source gas storage cylinder 154a is about to empty, valves 155a and 171a are closed to stop the gas flow from the dopant source gas storage cylinder 154a, while valves 155b and 157b are opened to supply the predetermined amount of the dopant source gas from the dopant source gas storage cylinder 154b to the ion source unit 110. In the meantime, valve 181a is closed and valve 181b is opened so that the outer pipe 162 of dopant source gas supply pipe 156b is maintained under a vacuum, and the leakage of the dopant source gas supply pipe 156b is monitored by the monitoring system 170.

In operation 416, once the dopant source gas supply is switched from the dopant source gas storage cylinder 154a to the dopant source gas storage cylinder 154b, thereby allowing the continuous supply of the dopant source gas from the dopant source gas supply system 150, valves 183a and 155a are opened such that residual dopant source gas in the dopant source gas storage cylinder 154a are evacuated by the vacuum pump 176 in the monitoring system 170.

Figure 5:
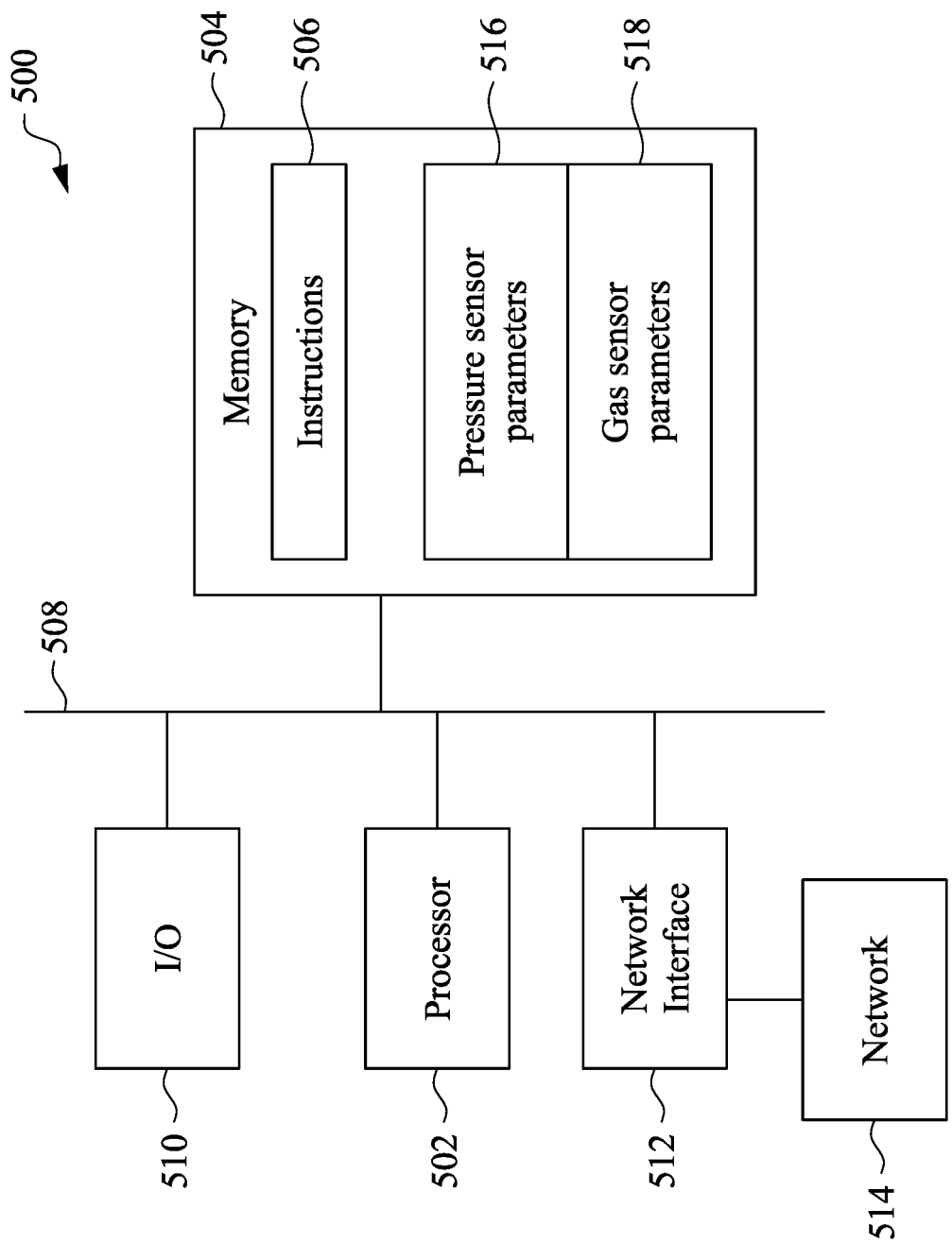
FIG. 5 is a block diagram of a control unit for controlling operations of the ion implantation system.

FIG. 5 is a block diagram of the control unit 500 for controlling operations of the ion implantation system 100, in accordance with some embodiments.

In some embodiments, the control unit 500 is a general purpose computing device including a hardware processor 502 and a non-transitory, computer readable storage medium 504 encoded with, i.e., storing, the computer program code, i.e., a set of executable instructions 506. The computer readable storage medium 504 is also encoded with instructions 506 for interfacing with components of the ion implantation system 100, e.g., ion implanter 104 and dopant source gas supply system 150. The processor 502 is electrically coupled to the computer readable storage medium 504 via a bus 508. The processor 502 is also electrically coupled to an I/O interface 510 by bus 508. A network interface 512 is also electrically connected to the processor 502 via a bus 508. The network interface 512 is connected to a network 514, so that processor 502 and computer readable storage medium 504 are capable of connecting to external elements via network 514. The processor 502 is configured to execute the computer program instructions 506 encoded in the computer readable storage medium 504 in order to cause the control unit 500 to be usable for performing a portion or all of the operations as described in the method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program instructions 506 configured to cause the control unit 500 to perform a portion or all of the method 400. In some embodiments, the computer readable storage medium 504 also stores information needed for performing the method 400 as well as information generated during the performance of the method 400, such as pressure sensor parameters 516 and gas sensor parameters 518, and/or a set of executable instructions to perform one or more operations of the method 400.

In some embodiments, the computer readable storage medium 504 stores computer program instructions 506 for interfacing with the ion implantation system 100. The computer program instructions 506 enable the processor 502 to generate operating instructions readable components in ion implanter 104, the dopant source gas supply system 150 and the monitoring system 170 to effectively implement the operations as described with respect to the ion implanter 104, the dopant source gas supply system 150 and the monitoring system 170.

The control unit 500 includes input/output (I/O) interface 510. The I/O interface 510 is coupled to external circuitry. In some embodiments, the I/O interface 510 includes a keyboard, keypad, mouse, trackball, trackpad, and/or cursor direction keys for communicating information and commands to the processor 502.

The control unit 500 also includes network interface 512 coupled to the processor 502. The network interface 512 allows the control unit 500 to communicate with the network 514, to which one or more other computer systems are connected. The network interface 512 includes wireless network interfaces such as BLUETOOTH, WIFI, WIMAX, GPRS, or WCDMA; or wired network interface such as ETHERNET, USB, or IEEE-1394. In some embodiments, the operations as described with respect to the method 400 are implemented in two or more control units 500, and information such as refracted light intensities and one or more threshold intensity values, are exchanged between different control units 500 via network 514.

The advantages and features of the disclosure are further appreciable through the following example embodiments:

In some embodiments, an ion implantation system includes an ion implanter in a housing. The ion implanter includes an ion source unit. The ion implantation system further includes a dopant source gas supply system. The dopant source gas supply system includes a first dopant source gas storage cylinder and a second dopant source gas storage cylinder in a gas cabinet outside of the housing and configured to supply a dopant source gas to the ion source unit, and a first dopant source gas supply pipe and a second dopant source gas supply pipe coupled to the first dopant source gas storage cylinder and the second dopant source gas storage cylinder, respectively. Each of the first dopant source gas supply pipe and the second dopant source gas supply pipe includes an inner pipe and an outer pipe enclosing the inner pipe. The ion implantation system further includes a monitoring system coupled to the outer pipe of each of the first dopant source gas supply pipe and the second dopant source gas supply pipe and configured to monitor a leakage of each of the first dopant source gas supply pipe and the second dopant source gas supply pipe.

In some embodiments, an ion implantation system includes an ion implanter in a housing. The ion implanter includes an ion source unit. The ion implantation system further includes a dopant source gas supply system. The dopant source gas supply system includes a plurality of dopant source gas storage cylinders in a gas cabinet disposed remotely from the housing. The plurality of dopant source gas storage cylinders includes a first set of the plurality of dopant source gas storage cylinders for supplying a first dopant source gas to the ion source unit and a second set of the plurality of dopant source gas storage cylinders for supplying a second dopant source gas to the ion source unit. The dopant source gas supply system further includes a plurality of dopant source gas supply pipes configured to couple the plurality of dopant source gas storage cylinders to the ion source unit. The plurality of dopant source gas supply pipes includes a first set of the plurality of dopant source gas supply pipes coupled to the first set of the plurality of dopant source gas storage cylinders and a second set of the plurality of dopant source gas supply pipes coupled to the second set of the plurality of dopant source gas storage cylinders. Each of the plurality of dopant source gas supply pips includes an inner pipe configured to flow a corresponding dopant source gas and an outer pipe enclosing the inner pipe. The ion implantation system further includes a monitoring system comprising a plurality of pressure sensors and a gas sensor coupled to the outer pipe of each of the plurality of dopant source gas supply pipes and configured to monitor a leakage of each of the plurality of dopant source gas supply pipes.

In some embodiments, a method includes supplying a dopant source gas from a first dopant source gas storage cylinder to an ion source unit of an ion implanter via an inner pipe of a first dopant source gas supply pipe. The ion implanter is disposed in a housing, the first dopant source gas storage cylinder is disposed in a gas cabinet located outside of the housing. The method further includes detecting a leakage of the dopant source gas by in situ monitoring a pressure change and the presence of the dopant source gas in an outer pipe of the first dopant source gas supply pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implantation system, comprising:
an ion implanter in a housing, the ion implanter comprising an ion source unit;
a dopant source gas supply system, comprising:
a first dopant source gas storage cylinder and a second dopant source gas storage cylinder in a gas cabinet outside of the housing and configured to supply a dopant source gas to the ion source unit; and
a first dopant source gas supply pipe and a second dopant source gas supply pipe coupled to the first dopant source gas storage cylinder and the second dopant source gas storage cylinder, respectively, each of the first dopant source gas supply pipe and the second dopant source gas supply pipe including an inner pipe and an outer pipe enclosing the inner pipe; and
a monitoring system coupled to the outer pipe of each of the first dopant source gas supply pipe and the second dopant source gas supply pipe and configured to monitor a leakage of each of the first dopant source gas supply pipe and the second dopant source gas supply pipe, wherein the monitoring system comprises a first pressure sensor coupled to the first dopant source gas supply pipe, a second pressure sensor coupled to the second dopant source gas supply pipe, and a gas sensor and a vacuum pump coupled to the first pressure sensor and the second pressure sensor.

2. The ion implantation system of claim 1, wherein each of the inner pipe and the outer pipe comprises an electrically insulating material.

3. The ion implantation system of claim 2, wherein each of the inner pipe and the outer pipe comprises polytetrafluoroethylene, polypropylene, polyethylene, or polyvinyl chloride.

4. The ion implantation system of claim 1, wherein an outlet port is disposed in the outer pipe of each of the first dopant source gas supply pipe and the second dopant source gas supply pipe, the outlet port configured to couple a corresponding dopant source gas supply pipe to the monitoring system.

5. The ion implantation system of claim 1, wherein the vacuum pump comprises a turbo pump and a dry pump.

6. The ion implantation system of claim 1, wherein the vacuum pump is coupled to each of the first dopant source gas storage cylinder and the second dopant source gas storage cylinder via an exhaust manifold.

7. The ion implantation system of claim 1, further comprising a control unit configured to control operations of ion implanter, the dopant source gas supply system and the monitoring system.

8. The ion implantation system of claim 1, wherein the first and second dopant source gas supply pipes are coupled to a dopant source gas input manifold that connects the first and second dopant source gas supply pipes to the ion source unit.

9. An ion implantation system, comprising:
an ion implanter in a housing, the ion implanter comprising an ion source unit;
a dopant source gas supply system, comprising:
a plurality of dopant source gas storage cylinders in a gas cabinet disposed remotely from the housing, the plurality of dopant source gas storage cylinders comprising a first set of the plurality of dopant source gas storage cylinders for supplying a first dopant source gas to the ion source unit and a second set of the plurality of dopant source gas storage cylinders for supplying a second dopant source gas to the ion source unit; and
a plurality of dopant source gas supply pipes configured to couple the plurality of dopant source gas storage cylinders to the ion source unit, the plurality of dopant source gas supply pipes comprising a first set of the plurality of dopant source gas supply pipes coupled to the first set of the plurality of dopant source gas storage cylinders and a second set of the plurality of dopant source gas supply pipes coupled to the second set of the plurality of dopant source gas storage cylinders, each of the plurality of dopant source gas supply pips comprising an inner pipe configured to flow a corresponding dopant source gas and an outer pipe enclosing the inner pipe; and
a monitoring system comprising a plurality of pressure sensors and a gas sensor coupled to the outer pipe of each of the plurality of dopant source gas supply pipes and configured to monitor a leakage of each of the plurality of dopant source gas supply pipes.

10. The ion implantation system of claim 9, wherein each of the inner pipe and the outer pipe comprises an electrically insulating material.

11. The ion implantation system of claim 9, wherein the monitoring system comprises a vacuum pump coupled to each of the outer pipe of each of the plurality of dopant source gas supply pipes.

12. The ion implantation system of claim 11, wherein the vacuum pump coupled to each of the plurality of dopant source gas storage cylinders.

13. The ion implantation system of claim 11, further comprising a plurality of mass flow controllers, the plurality of mass flow controllers comprising a first mass flow controller coupled to the first set of the plurality of dopant source gas supply pipes and a second mass flow controller coupled to the second set of the plurality of dopant source gas supply pipes.

14. The ion implantation system of claim 11, further comprising a plurality of valves coupled to the plurality of dopant source gas supply pipes.

15. The ion implantation system of claim 11, further comprising a plurality of valves coupled to the plurality of dopant source gas storage cylinders.

16. A method, comprising:
supplying a dopant source gas from a first dopant source gas storage cylinder to an ion source unit of an ion implanter via an inner pipe of a first dopant source gas supply pipe, wherein the ion implanter is disposed in a housing, the first dopant source gas storage cylinder is disposed in a gas cabinet located outside of the housing;

detecting a leakage of the dopant source gas by in situ monitoring a pressure change and/or the presence of the dopant source gas in an outer pipe of the first dopant source gas supply pipe; and stopping the supply of the dopant source gas from the first dopant source gas storage cylinder in response to a pressure increase and the presence of the dopant source gas in the outer pipe of the first dopant source gas supply pipe or in response to a pressure increase in the outer pipe of the first dopant source vas supply pipe.

17. The method of claim 16, further comprising supplying the dopant source gas from a second dopant source gas storage cylinder via a second dopant source gas supply pipe to the ion source unit, the second dopant source gas storage cylinder being disposed in the gas cabinet.

18. The method of claim 16, further comprising supplying the dopant source gas from a second dopant source gas storage cylinder via a second dopant source gas supply pipe to the ion source unit in response to the first dopant source gas storage cylinder is about to empty, the second dopant source gas storage cylinder being disposed in the gas cabinet.

19. The method of claim 18, further comprising evacuating the dopant source gas remained in the first dopant source gas storage cylinder.

20. The method of claim 16, further comprising triggering an alarm once the leakage of the dopant source gas is detected.

* * * * *